United States Patent [19]
Jacobson

[11] Patent Number: 6,124,851
[45] Date of Patent: *Sep. 26, 2000

[54] ELECTRONIC BOOK WITH MULTIPLE PAGE DISPLAYS

[75] Inventor: Joseph M. Jacobson, Waban, Mass.

[73] Assignee: E Ink Corporation, Cambridge, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/504,896

[22] Filed: Jul. 20, 1995

[51] Int. Cl.⁷ .............................. G09G 3/36; G09G 5/00
[52] U.S. Cl. .................... 345/206; 345/100; 345/107; 345/901; 349/89
[58] Field of Search .................. 345/901, 100, 345/204, 121, 206, 173, 205; 349/86–89; 281/16; 434/317, 178

[56] References Cited

U.S. PATENT DOCUMENTS

| | | |
|---|---|---|
| 2,800,457 | 7/1957 | Green et al. .............................. 252/316 |
| 3,036,388 | 5/1962 | Tate .............................. 35/66 |
| 3,384,488 | 5/1968 | Tulagin et al. .............................. 96/88 |
| 3,406,363 | 10/1968 | Tate .............................. 335/302 |
| 3,460,248 | 8/1969 | Tate .............................. 29/607 |
| 3,585,381 | 6/1971 | Hodson et al. .............................. 250/47 |
| 3,612,758 | 10/1971 | Evans et al. .............................. 178/5.4 R |
| 3,668,106 | 6/1972 | Ota .............................. 204/299 |
| 3,670,323 | 6/1972 | Sobel et al. .............................. 340/324 |
| 3,756,693 | 9/1973 | Ota .............................. 345/107 |
| 3,767,392 | 10/1973 | Ota .............................. 430/35 |
| 3,772,013 | 11/1973 | Wells .............................. 96/1.3 |
| 3,792,308 | 2/1974 | Ota .............................. 315/150 |
| 3,806,893 | 4/1974 | Ohnishi et al. . |
| 3,850,627 | 11/1974 | Wells et al. . |
| 3,892,568 | 7/1975 | Ota . |
| 4,041,481 | 8/1977 | Sato . |
| 4,045,327 | 8/1977 | Noma et al. . |
| 4,062,009 | 12/1977 | Raverdy et al. .............................. 340/324 R |
| 4,068,927 | 1/1978 | White . |
| 4,071,430 | 1/1978 | Liebert . |

(List continued on next page.)

FOREIGN PATENT DOCUMENTS

| | | |
|---|---|---|
| 0186710 | 7/1986 | European Pat. Off. . |
| 0268877 | 6/1988 | European Pat. Off. . |
| 0281204 | 9/1988 | European Pat. Off. . |
| 0361420 | 4/1990 | European Pat. Off. .............. 1/133 |
| 0 390 303 A2 | 10/1990 | European Pat. Off. . |
| 0396247 | 11/1990 | European Pat. Off. .............. 1/19 |
| 0443571 | 8/1991 | European Pat. Off. . |
| 0448853 | 10/1991 | European Pat. Off. .............. 1/167 |
| 0540281 | 5/1993 | European Pat. Off. . |
| 0570995 | 11/1993 | European Pat. Off. .............. 1/167 |
| 0575475 | 12/1993 | European Pat. Off. .............. 3/34 |
| 0586373 | 3/1994 | European Pat. Off. . |
| 0595812 | 5/1994 | European Pat. Off. .............. 3/34 |
| 0601072 | 6/1994 | European Pat. Off. .............. 1/167 |
| 0601075 | 6/1994 | European Pat. Off. . |
| 0604423 | 7/1994 | European Pat. Off. .............. 3/34 |

(List continued on next page.)

OTHER PUBLICATIONS

Ackerman, Jerry, "E Ink of Cambridge Gets Start–Up Funding", *Boston Globe,* Dec. 24, 1997.

(List continued on next page.)

*Primary Examiner*—Bipin Shalwala
*Assistant Examiner*—David L Lewis
*Attorney, Agent, or Firm*—Testa, Hurwitz&Thibeault LLP

[57] ABSTRACT

An electronic book comprising multiple, electronically addressable, page displays is described. Said page displays may be formed on flexible, thin substrates. Said book may additionally encompass memory, power, control functions and communications.

16 Claims, 10 Drawing Sheets

U.S. PATENT DOCUMENTS

| | | | |
|---|---|---|---|
| 4,088,395 | 5/1978 | Giglia | 350/357 |
| 4,123,346 | 10/1978 | Ploix . | |
| 4,126,528 | 11/1978 | Chiang | 204/180 R |
| 4,126,854 | 11/1978 | Sheridon | 340/373 |
| 4,143,103 | 3/1979 | Sheridon | 264/4 |
| 4,203,106 | 5/1980 | Dalisa et al. . | |
| 4,218,302 | 8/1980 | Dalisa et al. . | |
| 4,231,641 | 11/1980 | Randin | 350/357 |
| 4,261,653 | 4/1981 | Goodrich | 350/362 |
| 4,272,596 | 6/1981 | Harbour | 430/37 |
| 4,298,448 | 11/1981 | Müller et al. | 204/299 R |
| 4,305,807 | 12/1981 | Somlydy | 204/299 R |
| 4,311,361 | 1/1982 | Somlyody | 350/267 |
| 4,324,456 | 4/1982 | Dalisa | 350/362 |
| 4,368,952 | 1/1983 | Murata et al. | 350/362 |
| 4,390,403 | 6/1983 | Batchelder . | |
| 4,418,346 | 11/1983 | Batchelder | 340/787 |
| 4,419,383 | 12/1983 | Lee | 427/47 |
| 4,430,648 | 2/1984 | Togashi et al. | 345/205 |
| 4,438,160 | 3/1984 | Ishikawa et al. | 427/214 |
| 4,450,440 | 5/1984 | White . | |
| 4,522,472 | 6/1985 | Liebert et al. . | |
| 4,643,528 | 2/1987 | Bell, Jr. | 350/334 |
| 4,648,956 | 3/1987 | Marshall et al. . | |
| 4,703,573 | 11/1987 | Montgomery et al. | 40/455 |
| 4,741,604 | 5/1988 | Kornfeld . | |
| 4,746,917 | 5/1988 | Di Santo et al. | 340/797 |
| 4,772,102 | 9/1988 | Fergason et al. | 350/338 |
| 4,824,208 | 4/1989 | Fergason et al. | 350/276 SL |
| 4,832,458 | 5/1989 | Fergason et al. | 350/338 |
| 4,833,464 | 5/1989 | Di Santo et al. | 340/793 |
| 4,919,521 | 4/1990 | Tada et al. | 350/362 |
| 4,947,159 | 8/1990 | Di Santo et al. | 340/787 |
| 4,947,219 | 8/1990 | Boehm | 357/20 |
| 5,006,212 | 4/1991 | Di Santo et al. | 204/192.14 |
| 5,041,824 | 8/1991 | Di Santo et al. | 340/787 |
| 5,053,763 | 10/1991 | Di Santo et al. | 340/787 |
| 5,057,363 | 10/1991 | Nakanishi | 428/321.5 |
| 5,066,946 | 11/1991 | Di Santo et al. | 340/787 |
| 5,070,326 | 12/1991 | Yoshimoto et al. | 340/719 |
| 5,077,157 | 12/1991 | Di Santo et al. | 430/20 |
| 5,082,351 | 1/1992 | Fergason | 359/51 |
| 5,105,185 | 4/1992 | Nakanowatari et al. | 340/784 |
| 5,128,785 | 7/1992 | Yoshimoto et al. | 359/58 |
| 5,167,508 | 12/1992 | McTaggart | 434/317 |
| 5,174,882 | 12/1992 | Di Santo et al. | 204/299 R |
| 5,177,476 | 1/1993 | Di Santo et al. | 340/787 |
| 5,187,609 | 2/1993 | DiSanto et al. . | |
| 5,216,416 | 6/1993 | Di Santo et al. | 340/787 |
| 5,223,115 | 6/1993 | Di Santo et al. | 204/299 |
| 5,223,823 | 6/1993 | DiSanto et al. . | |
| 5,247,290 | 9/1993 | Di Santo et al. | 345/107 |
| 5,250,932 | 10/1993 | Yoshimoto et al. | 345/206 |
| 5,250,938 | 10/1993 | DiSanto et al. . | |
| 5,254,981 | 10/1993 | DiSanto et al. . | |
| 5,262,098 | 11/1993 | Crowley et al. . | |
| 5,266,937 | 11/1993 | Di Santo et al. | 345/107 |
| 5,270,843 | 12/1993 | Wang | 359/52 |
| 5,276,438 | 1/1994 | DiSanto et al. . | |
| 5,279,694 | 1/1994 | DiSanto et al. . | |
| 5,293,528 | 3/1994 | DiSanto et al. . | |
| 5,302,235 | 4/1994 | DiSanto et al. . | |
| 5,304,439 | 4/1994 | DiSanto et al. . | |
| 5,315,312 | 5/1994 | DiSanto et al. . | |
| 5,316,341 | 5/1994 | Schwartz | 281/16 |
| 5,344,594 | 9/1994 | Sheridon . | |
| 5,345,251 | 9/1994 | DiSanto et al. . | |
| 5,359,346 | 10/1994 | DiSanto et al. . | |
| 5,377,258 | 12/1994 | Bro | 379/93 |
| 5,383,008 | 1/1995 | Sheridon . | |
| 5,389,945 | 2/1995 | Sheridon | 345/85 |
| 5,398,131 | 3/1995 | Hall et al. | 359/465 |
| 5,402,145 | 3/1995 | DiSanto et al. . | |
| 5,407,231 | 4/1995 | Schwartz | 281/16 |
| 5,412,398 | 5/1995 | DiSanto et al. . | |
| 5,460,688 | 10/1995 | DiSanto et al. . | |
| 5,467,107 | 11/1995 | DiSanto et al. . | |
| 5,484,292 | 1/1996 | McTaggart | 343/317 |
| 5,485,176 | 1/1996 | Ohara et al. | 345/173 |
| 5,499,038 | 3/1996 | DiSanto et al. . | |
| 5,508,068 | 4/1996 | Nakano | 428/1 |
| 5,508,720 | 4/1996 | DiSanto et al. . | |
| 5,512,162 | 4/1996 | Sachs et al. . | |
| 5,534,888 | 7/1996 | Lebby et al. | 345/121 |
| 5,538,430 | 7/1996 | Smith et al. | 434/178 |
| 5,561,443 | 10/1996 | Disanto et al. . | |
| 5,565,885 | 10/1996 | Tamanoi | 345/100 |
| 5,573,711 | 11/1996 | Hou et al. . | |
| 5,627,561 | 5/1997 | Laspina et al. . | |
| 5,643,673 | 7/1997 | Hou . | |
| 5,707,738 | 1/1998 | Hou . | |
| 5,708,525 | 1/1998 | Sheridon . | |
| 5,717,514 | 2/1998 | Sheridon . | |
| 5,717,515 | 2/1998 | Sheridon . | |
| 5,737,115 | 4/1998 | Mackinlay et al. . | |

FOREIGN PATENT DOCUMENTS

| | | | |
|---|---|---|---|
| 0 618715 A1 | 10/1994 | European Pat. Off. . | |
| 0721176 | 7/1996 | European Pat. Off. . | |
| 53-73098 | 6/1978 | Japan . | |
| 55-096922 | 7/1980 | Japan | 1/133 |
| 59-098227 | 6/1984 | Japan . | |
| 62-0582222 | 3/1987 | Japan . | |
| 62-058222 | 8/1987 | Japan . | |
| 62-269124 | 11/1987 | Japan | 1/19 |
| 62-231930 | 4/1988 | Japan . | |
| 01086116 | 3/1989 | Japan | 1/19 |
| 01086117 | 3/1989 | Japan | 1/19 |
| 64-86116 | 3/1989 | Japan | 1/19 |
| 01142537 | 6/1989 | Japan | 1/19 |
| 01177517 | 7/1989 | Japan | 1/19 |
| 01248182 | 10/1989 | Japan | 9/37 |
| 01267525 | 10/1989 | Japan | 1/19 |
| 3118196 | 5/1991 | Japan . | |
| 05173194 | 7/1993 | Japan | 1/167 |
| 6089081 | 6/1994 | Japan . | |
| 6-202168 | 7/1994 | Japan . | |
| 9-6277 | 1/1997 | Japan . | |
| 9-185087 | 7/1997 | Japan . | |
| 1314906 | 4/1973 | United Kingdom . | |
| 1465701 | 3/1977 | United Kingdom | 9/12 |
| 2306229 | 4/1997 | United Kingdom . | |
| 82/02961 | 9/1982 | WIPO | 1/19 |
| 93/02443 | 2/1993 | WIPO | 3/34 |
| 93/04458 | 4/1993 | WIPO . | |
| 93/04459 | 4/1993 | WIPO | 3/34 |
| 93/07608 | 4/1993 | WIPO | 3/34 |
| 94/24236 | 10/1994 | WIPO | 169/4 |
| 95/07527 | 3/1995 | WIPO | 3/34 |
| 95/10107 | 4/1995 | WIPO | 3/34 |

OTHER PUBLICATIONS

Pearlstein, F., "Electroless Plating," Modern Electroplating, John Wiley & Sons, New York pp. 710–747 (1974).

Gutcho, M., Microcapsules and Microencapsulation Techniques, Noyes Data Corp., Park Ridge, NJ (1976), pp. 65–130, 157–193 and 279–343.

Dalisa (1977), "Electrophoretic Display Technology," *Trans. on Electron Devices,* 24:7, 827–834.

Quon (1977), "Multilevel Voltage Select (MLVS): A Novel Technique to X–Y Address an Electrophoretic Image Display," *Correspondence* 1120–1123.

Singer et al. (1977), "An X–Y Addressable Electrophoretic Display," *Proc. of the SID* 183:3–4, 255–266.

Wrighton, M. S. et al., "Photoelectrolysis of Water by Irradiation of Platinized n–Type Semiconducting Metal Oxides," Journal of Solid State Chemistry, No. 22, pp. 17–19, 1977.

Blazo (1982), "High Resolution Electrophoretic Display With Photoconductor Addressing," *SID 82 Digest* 92–93.

Sheridon et al. (1982), "A Photoconductor–Addressed Electrophoretic Cell for Office Data Display," *SID 82 Digest* 94–95.

Kornfeld (1984), "A Defect–Tolerant Active–Matrix Electrophoretic Display," *SID 84 Digest* 142–144.

Murau (1984), "Characteristics of an X–Y Addressed Electrophoretic Image Display (EPID)," *SID 84 Digest* 141.

Shiffman et al. (1984), "An Electrophoretic Image Display With Internet NMOS Address Logic and Display Drivers," *Proc. of SID* 25:2, 105–115.

Shiwa et al. (1988), "Electrophoretic Display Method Using Ionographic Technology," *SID 88 Digest* 61–62.

Yamaguchi et al. (1991), "Equivalent Circuit of Ion Projection–Driven Electrophoretic Display," *IEICE Trans.* 74:12, 4152–4156.

Moesner, F., et al., "Device for particle handling by an AC electric field," Proceedings. IEEE Micro Electro Mechanical System 1995, p 418, 66–71.

Hatano, T., et al., "Bistable Paper White Display Device Using Cholesteric Liquid Crystals," Society for Information Display Conference Digest, paper 18.3, San Diego, CA, 1996.

Howe, Peter J., "MIT Book Would Bind Computer "Ink" to Paper," Boston Globe, Mar. 17, 1996, p. 31, 35.

Ji, Y., et al., "Polymer Walls in Higher–Polymer Content Bistable Reflective Cholesteric Displays," Society for Information Display Conference Digest, poster P–50, San Diego, CA, 1996.

The Sunday Times, Feb. 25, 1996, Book Review.

Vizard, (1997), Frank, "Electric Tales Computer Chips Replace Wood Chips in the Page of 21st Century Book." PopularScience.

"WIRED 5 05: Digital Ink," http://www.wired.com/wired/5.05/features/ff_digitalink.html, Feb. 6, 1998, 7 pgs.

Ballinger et al., "Magnetic Recording Paper is Erasable", *Electronics*, pp. 73–76, Mar. 1, 1973.

Sankus, J., "Electrophoretic Display Cell", *Xerox Disclosure Journal*, 1979, 4 (3), 309.

Beilin et al., "2000— Character Electrophoretic Display", *SID 86 Digest*, 1986, 136–140.

Chiang et al., "A High Speed Electrophoretic Matrix Display", *SID 80 Digest*, 1980, 114–115.

Fitzhenry–Ritz, B., "Optical Properties of Electrophoretic Image Displays", *Proceedings of the SID*, 1981, 22 (4), 300–309.

Goodman, L.A., "Passive Liquid Displays: Liquid Crystals, Electrophoretics, and Electrochromics", *Proceedings of the SID*, 1976, 17 (1), 30–38.

Lewis, J.C., "Gravitational, Inter–Particle and Particle–Electrode Forces in the Electrophoretic Display", *Proceedings of the SID*, 1977, 18 (3 and 4), 235–242.

Murau et al., "The Understanding and Elimination of Some Suspension Instabilities in an Electrophoretic Display", *American Institute of Physics*, 1978, 49 (9), 4820–4829.

Murau et al., "An Electrophoretic Radiographic Device", *SID 79 Digest*, 1979, 46–47.

Ota et al., "Developments in Electrophoretic Displays", *Proceedings of the SID*, 1977, 18 (3 and 4), 243–254.

Ota et al., "Electrophoretic Display Devices", *Laser 75 Optoelectronics Conference Proceedings*, 1975, 145–148.

Ota et al., "Electrophoretic Image Display (EPID) Panel", *Proceedings of the IEEE*, 1973, 1–5.

Ziemells, K., "Putting it on Plastic", *Nature*, Jun. 1998, 393, 619–620.

Vance, D., "Optical Characteristics of Electrophoretic Displays", *Proceedings of the SID*, 1977, 18 (3 and 4), 267–274.

Hopper et al., "An Electrophoretic Display, Its Properties . . . ", *IEEE Transactions On Electron Devices*, 1979, ED–26 (8), 1148–1152.

White, R., "An Electrophoretic Bar Graph Display", *Proceedings of the SID*, 1981, 22 (3), 173–180.

Vaz, N. A. and Montgomery, G. P., Jr., "Dual Frequency Addressing of Polymer–Dispersed Liquid–Crystal Films", *J. of Applied Physics*, vol. 65, No. 12, pp. 5043–5050 (Jun. 15, 1998).

Lee, L. L., "Fabrication of Magnetic Particles Displays," Proceeding of the S.I.D., vol. 18/3 & 4, pp. 283–288, (1977).

Sheridon, N. K., et al., "The Gyricon —A Twisting Ball Display," Proceeding of the S.I.D., vol. 18/3 & 4, pp. 289–293, (1977).

Saitoh, M., et al., "A Newly Developed Electrical Twisting Ball Display," Proceedings of the SID, vol. 23/4, pp. 249–253, (1982).

Egashira, N., et al., "A Solid Electrochromic Cell Consisting of Lu–Diphthalocyanine and Lead Fluoride," Proceedings of the SID, vol. 28/3, pp. 227–232, (1987).

Bohnke, O., et al., "Polymer–Based Solid Electrochromic Cell for Matrix–Addressable Display Devices," *J. Electrochem. Soc.*, 138(12) :3612–3617, (Dec. 1991).

Hosaka, H., et al., "Electromagnetic microrelays: concepts and fundamental characteristics," *Sensors and Actuators A*, pp. 41–47, (1994).

Clarisse, C., et al., "Field–Effect Transistor With Diphthalocyanine Thin Film," *Electronics Letters*, 24 (11) :674–675, (May 1988).

Yang, Y., et al., "A new architecture for polymer transistors," *Nature*, vol. 372, (Nov. 1994).

Jin, S., et al., "Optically Transparent, Electrically Conductive Composite Medium," *Science*, pp. 446–448. (Jan. 1992).

Bryce, M. R., "Seeing through synthetic metals," *Nature*, vol. 335, (Sep. 1988).

Pankove, Jacques L., RCA Technical Notes, RCA TN No.: 535, Mar. 1962, Sheets 1 and 2.

ELECTRONIC BOOK WITH MULTIPLE PAGE DISPLAYS

BACKGROUND

Presently the concept of an electronic book (such as the omni book concept invented by Alan Kay now of Apple Computer) connotes a device with a single electronically addressable display in which pages of text are displayed sequentially in time as a function of some input. On the other hand real paper books contain multiple pages which may be accessed by means of a natural haptic input. Such pages however, once printed, are not changeable.

In this disclosure we describe an electronic book with multiple electronically addressable displays. Such an electronic book embodies the representation of information on a multiplicity of physical pages which may be may be electronically addressed or 'typeset' such that the contents of said pages may be changed by means of an electronic signal and which may further be handled, physically moved and written on. The advantages of the present invention include the ability, from within a single electronic book, to access a large realm of information, which would normally encompass many volumes of standard paper books while still maintaining the highly preferred natural haptic and visual interface of said normal paper books. As such, an electronic book with multiple electronically addressable page displays, as disclosed herein, constitutes a highly useful means of information interaction.

SUMMARY OF THE INVENTION

The invention provides for an electronic book with multiple electronically addressable page displays. In one embodiment such page displays may be thin, low cost and formed on paper or paper like substrates. Such substrates may be real paper, ultra thin glass, plastic, polymer, elastomer or other suitable material which embody some or a majority of paper like qualities including thinness, structure, manipulability or other characteristics normally associated with paper in its role as a haptically and visually interactable display of information. Said page displays additionally comprise address lines and electronically addressable contrast media which may be bistable media such that texts or images written to said page displays may be maintained without the application of power. Said page displays may further comprise page strobe or page address logic for the purpose of electrically addressing a particular page in said multiple page display book.

Said book may additionally contain electronic memory, an internal power source, controls and interfaces, which may either be wired, wireless or optical, for interfacing to various sources of data or communications. Such an electronic memory may contain the informational content, both textual and graphical, comprised in a multiplicity of normal paper books. A user may then select a book of choice and cause, by means of a control, the electronically addressable pages of said book to be 'typeset' such that after some time delay the pages of said electronic book display the desired contents.

The invention provides for means of manufacturing the pages of said electronic book in a low cost way on a paper or paper like substrate. The invention further provides for means of binding such pages and addressing such a multiple page electronic book. Additional features including an interface and the ability to write in a reversible manner and have such writing recorded are also described. Further features and aspects will become apparent from the following description and from the claims.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF A PREFERRED EMBODIMENT

Figure 1B:
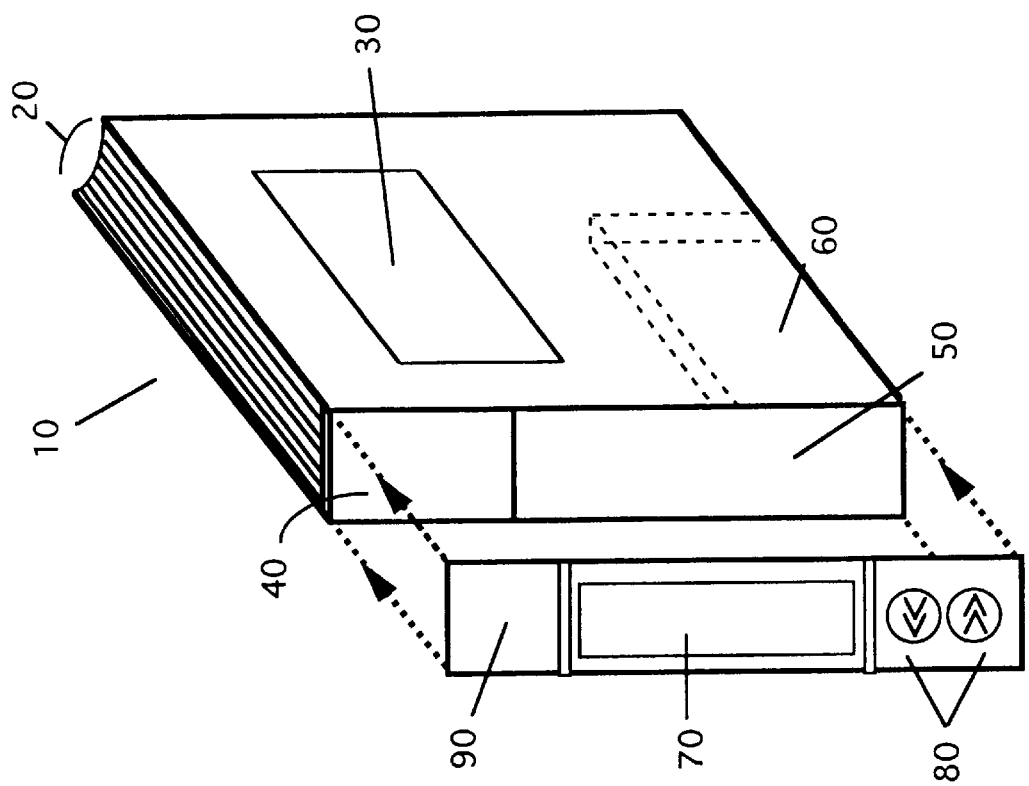
FIGS. 1A and 1B are partially perspective and partially schematic views of an electronic book with multiple electronically addressable pages.
Figure 1A:
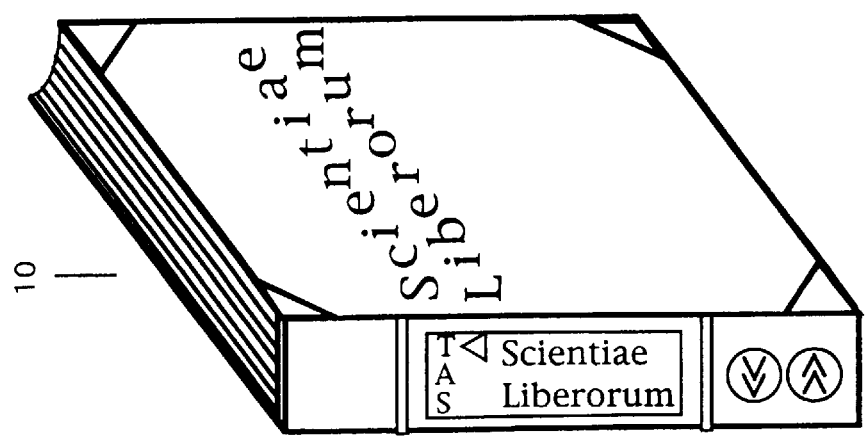

Referring to FIGS. 1A and 1B, a book 10 is composed of multiple electronically addressable page displays forming a multiple page display ensemble 20 in which each page of said ensemble may be individually electronically addressed. Said book may additionally contain: An internal power source 40 such as a battery; Electronic display drivers 50 to write information to said page displays where said drivers may write information contained in a memory or alternatively may write information obtained via a suitable interface or alternatively may write information from another source such as an electronic pen or stylus or from another suitable source. Memory 60 which may be a solid state memory such as flash memory or bubble memory or may be another form of memory such an optical disk or magnetic media or may be any other form of memory. Such memory may contain information including text and/or graphics. Such information may be for instance the text and graphics of a selection of books or journals. Further said memory may be programmable or reprogrammable. Alternatively said memory may be permanent. Said memory may also be removable for the purposes of reprogramming or for other purposes. Alternatively said memory may be a fixed memory. Said memory may also be interfaced to said electronic drivers and may further be interfaced to an external source. A fast display 70 which may be an LCD display for displaying a certain subset of the information contained in said memory such as book titles. Control buttons 80 which may be used for accessing the information contained in said memory and causing said information to be displayed on said fast display or on said page displays or to access some other control function. A title space 30 which may be composed of a similar electronically addressable structure to said page displays. Additional electronic elements 90 which may include a receiver or transmitter or other means of communications such as a data port or a modem or any other suitable interface. Said additional components may additionally contain a processor or microprocessor and any other components known in the art of computers or portable computers or any other electronic components useful in the operation of said electronic book.

Figure 2:
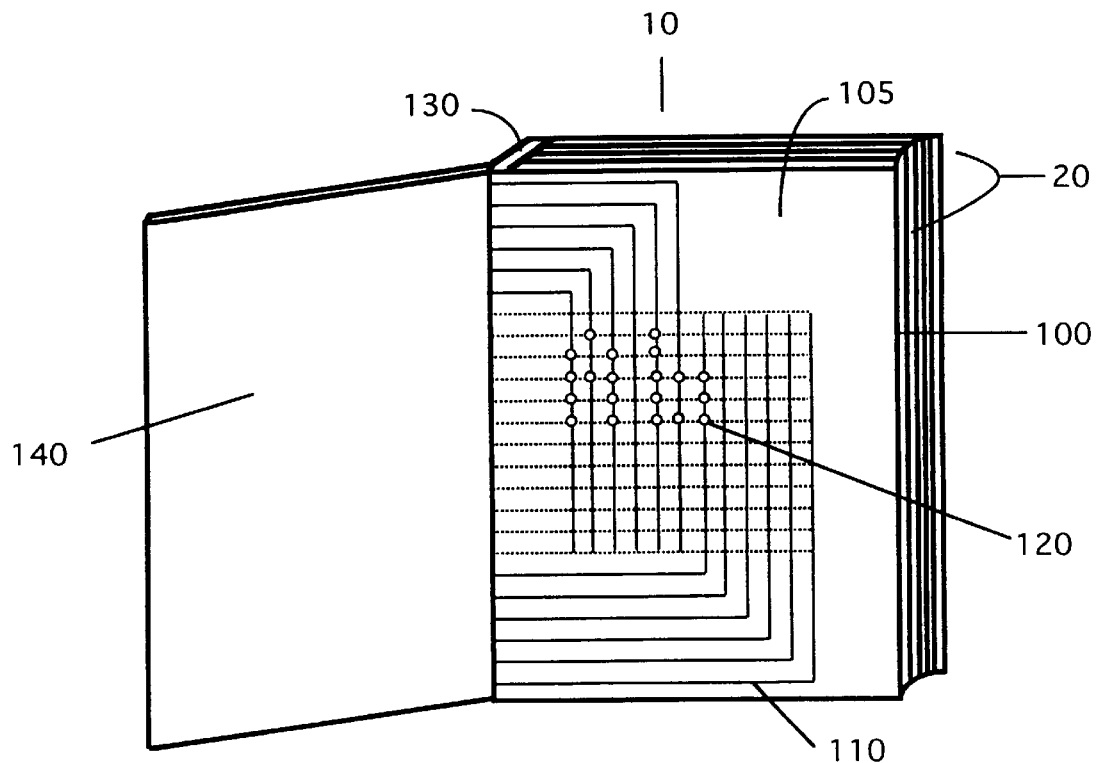
FIG. 2 is a partially perspective and partially schematic view of an electronic book with multiple electronically addressable pages open to a single such page.

Referring to FIG. 2 said book 10 contains electronically addressable page displays 100 which combine to form an ensemble of multiple page displays 20. Said book may additionally comprise a cover 140 and spine 130 which may hold various elements as described in reference to FIGS. 1A and 1B. Such page displays 100 are composed of a substrate 105, an electronically addressable contrast media 120, and address lines 110. Said book 10 and said page displays 100 are configured such that substantially different information can be written or electronically 'typeset' on the different page displays 100 which comprise the multiple page ensemble 20.

In a preferred embodiment said page displays may be thin, low cost and formed on paper or paper like substrates. Such substrates may be real paper, synthetic paper, ultra thin glass, plastic, polymer, elastomer, thin metal, carbon fiber or other suitable material which embody some or a majority of paper like qualities including thinness, structure, manipulability or other characteristics normally associated with paper in its role as a haptically and visually interactable display of information.

Said address lines may be composed of transparent conducting polymers, transparent conductors such as Indium Tin Oxide, thin metal conductors or other suitable conductors. Such address lines may be applied by vacuum deposition, sputtering, photolithography or may be printed via ink jet systems or laser printer systems or may be applied via other appropriate means. Further such address lines may additionally be insulated with an appropriate insulator such as a non conducting polymer or other suitable insulator. Alternatively insulating layers may be applied in such manner to effect electrical isolation between row and row conducting lines, between row and column address lines, between column and column address lines or for other purposes of electrical isolation.

Said contrast media may be electrochromic material, rotatable microencapsulated microspheres, polymer dispersed liquid crystals (PDLCs), polymer stabilized liquid crystals, surface stabilized liquid crystal, smectic liquid crystal, ferroelectric material, electroluminescent material or any other of a very large number of contrast media known in the prior art. Certain such contrast media, such as microencapsulated media may be printed via an ink jet or ink jet like system or may be applied via other appropriate means.

Figure 3:
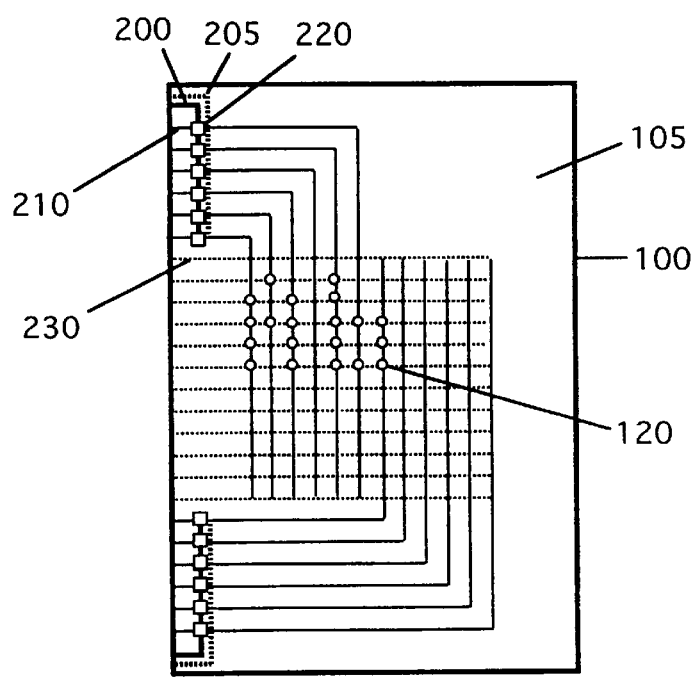
FIG. 3 is a schematic view of an electronically addressable page configured for simplified address line layout and partial page addressability with column strobe.

FIG. 3 depicts a preferred embodiment of a page display 100 incorporating a simplified address line scheme configured for partial page addressability. A substrate 105 has deposited on or embedded in it an underlying array of row address lines 230, an electronically addressable contrast media 120 and an array of column address lines 210. A book configuration requires that all address lines are substantially accessible along or near a single edge of the book page. Such is the case with the schemes described in this disclosure. In the preferred embodiment row lines 230 and column lines 210 are common to each page in the multiple page ensemble. Pages are addressed individually via a page address strobe comprised of page address strobe control lines 200 and 205 and page address strobe switches 220 which control whether or not a particular page's column address lines are active in response to signal applied to said page address strobe control lines. It is understood however that in each of the embodiments described page strobing may be obviated in exchange for a more complicated spine driver in which each page in the multiple page ensemble may be wired directly and separately to the display driver.

Figure 4:
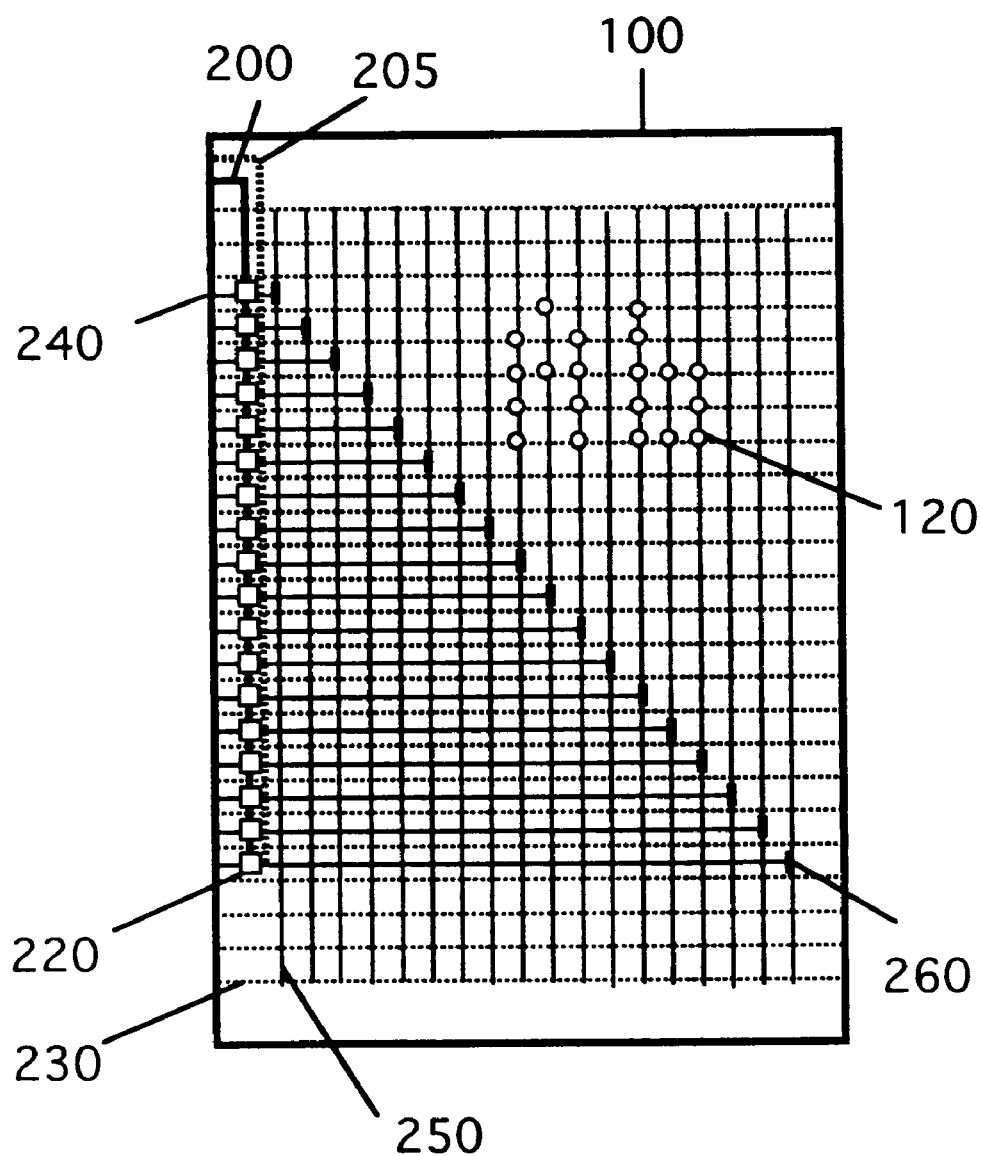
FIG. 4 is a schematic view of an electronically addressable page configured for multilayer address line layout and full page addressability with column strobe.

FIG. 4 depicts a preferred embodiment of a page display 100 incorporating a multilayer address line scheme configured for full page addressability. Edge column address line connectors 240 are connected to column address lines 250 via a conducting connection 260. Such a connection may be of conducting polymer, ITO, metal or other suitable conductor or may be a direct connection of the line 240 to 250 which may further be bonded with a laser weld or non conducting or conducting epoxy or other adhesive. In all other areas where column address line connectors 240 cross column address lines 250 there is no conducting connection as effected by the placement of a suitable insulating layer. The page strobe composed of page strobe control lines 200 and 205 and page strobe switches 220 operate as in FIG. 3 to control the state of said column address lines. As before column and row address lines may be common to each page in the multiple page ensemble.

Figure 5A:
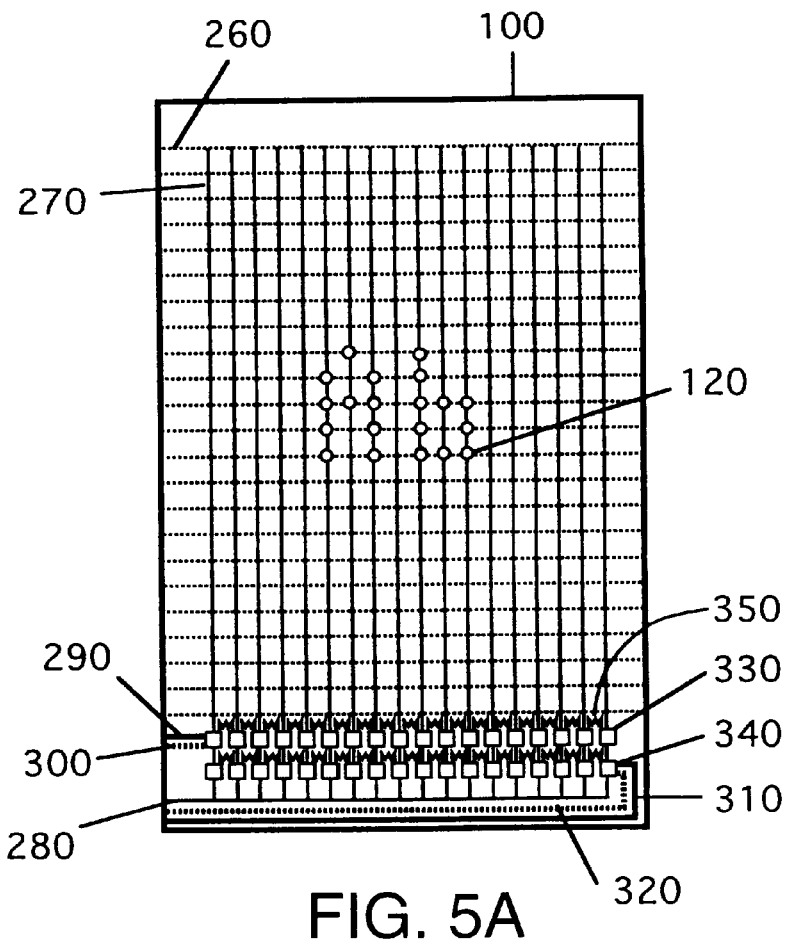
FIG. 5A is a schematic view of an electronically addressable page configured for row addressing with analog selected column lines and FIG. 5B is a schematic detail of the analog column select scheme.

FIG. 5A is a schematic view of an electronically addressable page 100 in which row lines 260 emanate from the page edge and are connected to the display driver. Row lines may be common to each page. Column address lines are analog selected by means of applying appropriate voltages between analog column switch control line 290 and 300 and 310 and 320.

Figure 5B:
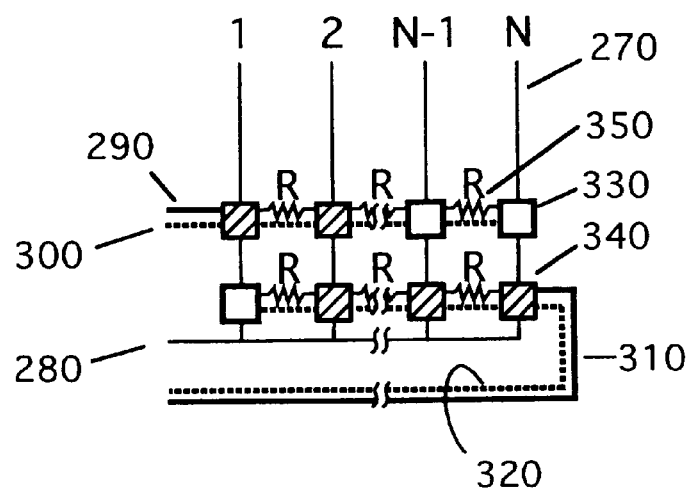

Referring to the detail of FIG. 5B, the analog column select scheme operates as follows: Each column address line 270 may be denoted by a number j between 1 and N where N is the total number of column address lines per page. Each column address line in turn is controlled via a set of two column switches, 330 and 340, each of which in turn may be given designations k and l for the top and bottom control switches (330 and 340) respectively where k and l both range from 1 to N.

Said column switches 330 and 340 have a uniform threshold in which the column address lines 270 which they control become active (closed circuit, denoted by a black filled box) if said column switch's control lines 290 and 300 and 310 and 320 respectively have a potential difference greater than a threshold voltage $V_{th}$ as measured at said switch control line input. Resistors 350 connect said switches 330 or 340 such that for a given applied potential difference on said switch control lines each switch sees a different and monotonicly scaled potential difference at its control line input face. Consider the case in which switch control line 290 and 310 are held at voltage $V_1$ and $V_2$ respectively and switch control lines 300 and 320 are held at ground. The criterion for column address line j to be active and thus be at the potential $V_c$ applied to common column address line bias 280 is:

$V_1/(j*R)>V_{th}$ and $V_2/((N-j)*R)>V_{th}$

Thus by choosing an appropriate value of $V_1$ and $V_2$ a single column address line may be selected. In the example shown in the detail black filled control switches denote a closed switch condition and white filled control switches denote an open switch condition. Column line 2 has been made active by the appropriate choice of $V_1$ and $V_2$ whereas all other column lines are inactive as for all other column lines at least one column control switch is in the open circuit state. It is understood that a further simplification may be made by making $V_2$=constant−$V_1$ such that only a single voltage line need be addressed. The analog column switch control line or lines are unique and not common to each page thereby allowing for page selectability.

Figure 6A:
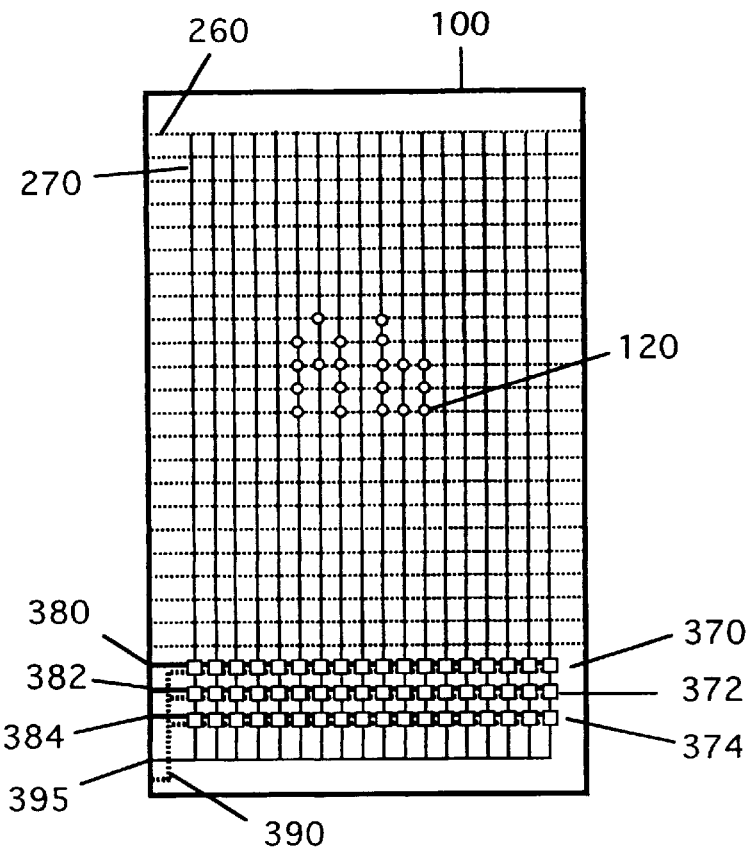
FIG. 6A is a schematic view of an electronically addressable page configured for row addressing with digital selected column lines and FIG. 6B is a schematic detail of the digital column select scheme.

FIG. 6A is a schematic view of an electronically addressable page 100 in which row lines 260 emanate from the page edge and are connected to the display driver. Row lines may be common to each page. Column address lines are digital selected by means of applying appropriate logical values for digital column switch control lines 380,382 and 384 with ground 390.

Figure 6B:
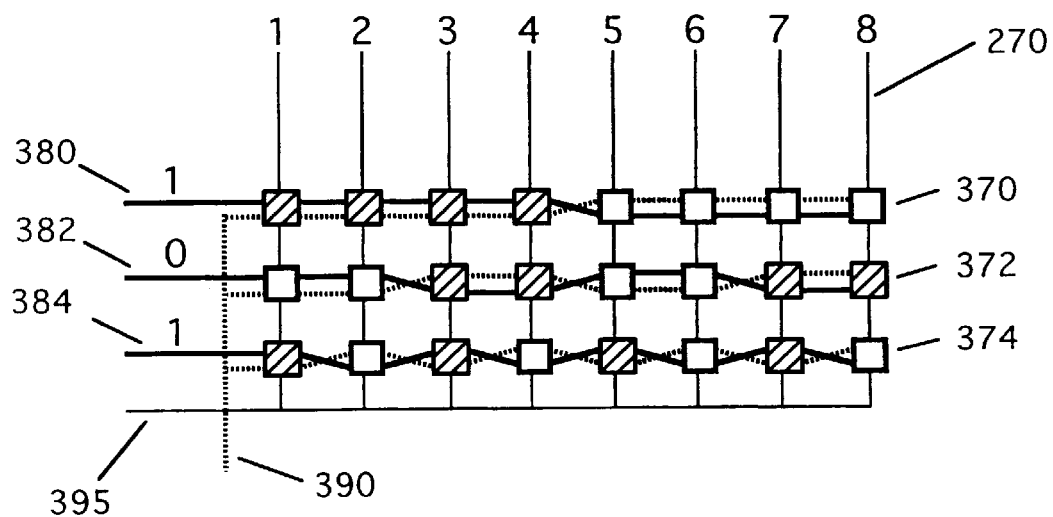
Figure 7A:
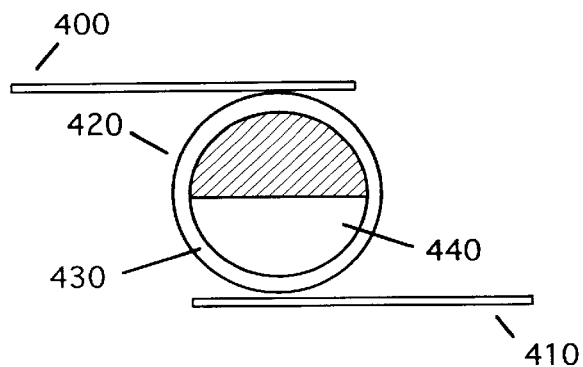
FIGS. 7A–7D are schematic details of various electronically addressable contrast media.
Figure 7B:
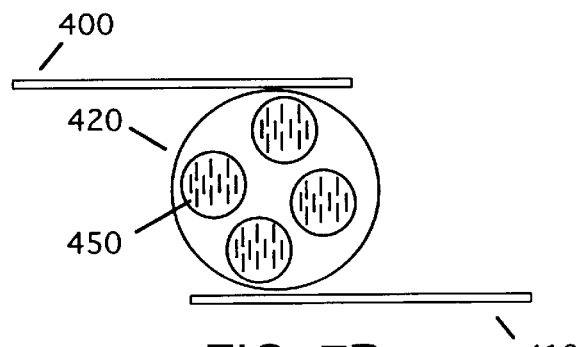
Figure 7C:
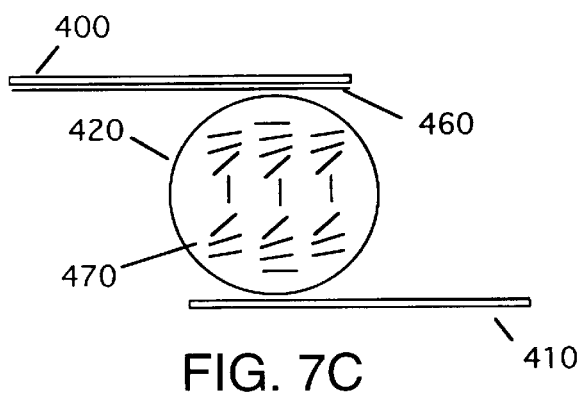
Figure 7D:
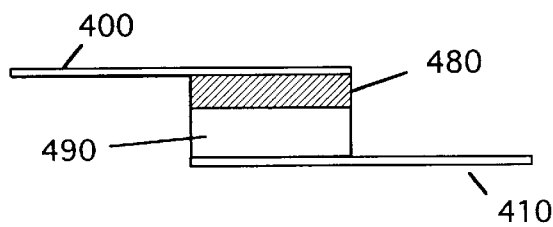
Figure 8A:
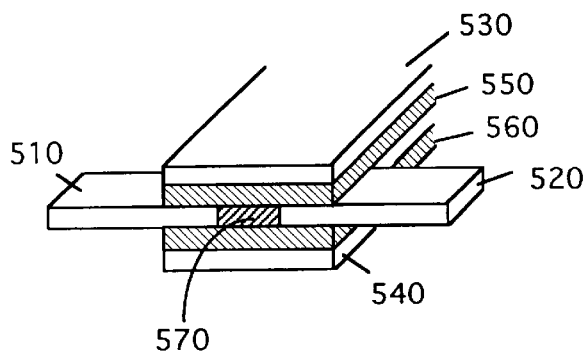
FIGS. 8A–8E are schematic details of various switch and relay assemblies.
Figure 8B:
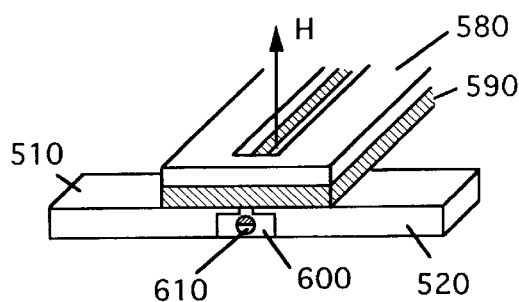
Figure 8C:
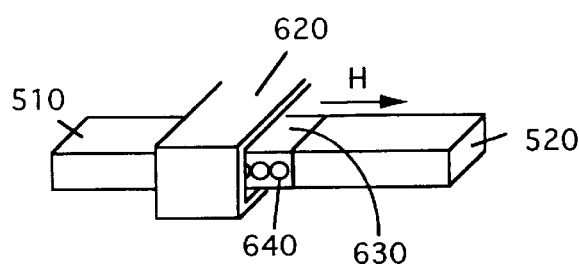
Figure 8D:
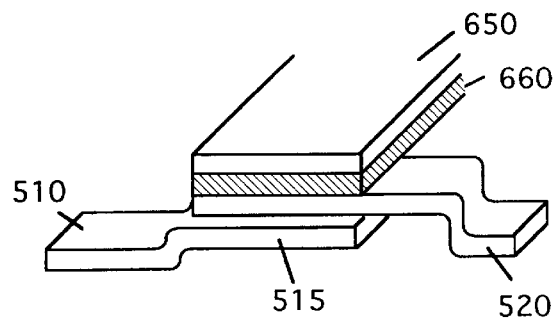
Figure 8E:
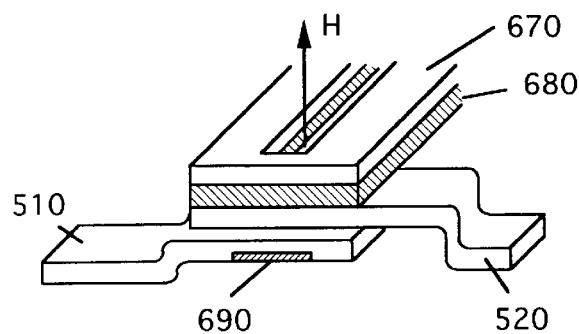
Figure 9A:
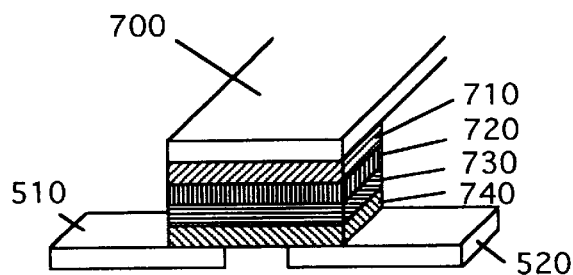
FIGS. 9A–9E are schematic details of various switch structures.
Figure 9B:
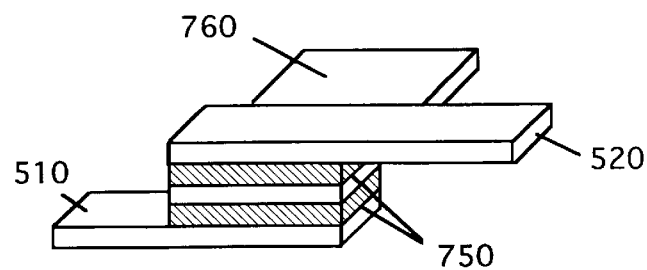
Figure 9C:
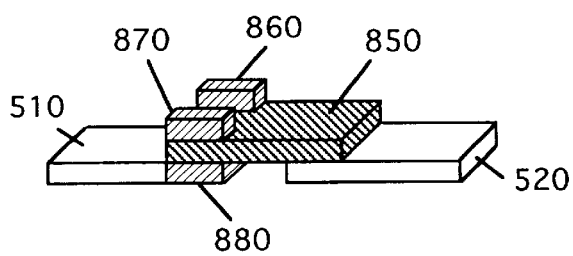
Figure 9D:
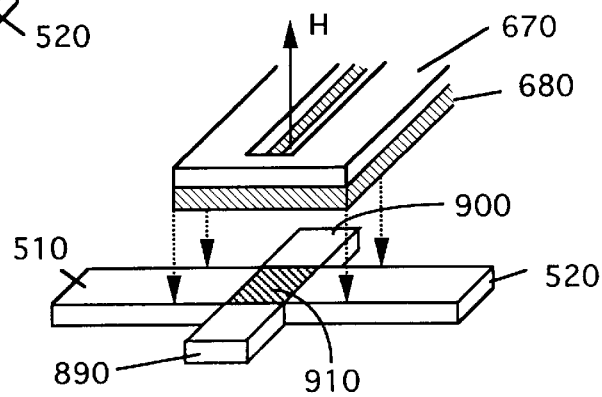
Figure 9E:
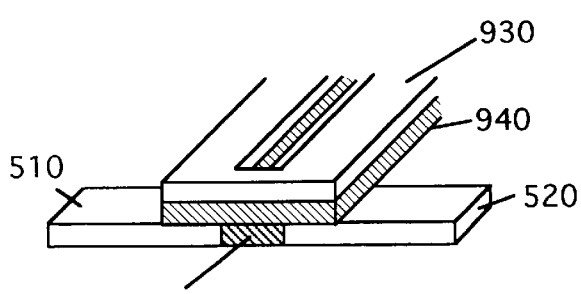
Figure 10A:
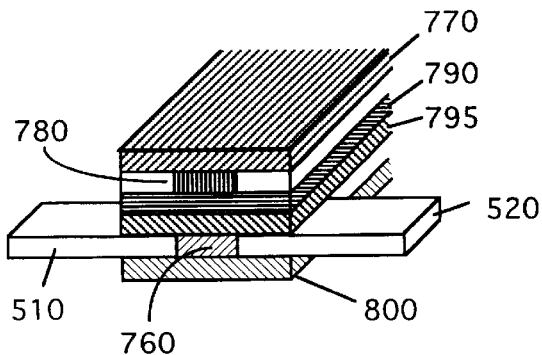
FIGS. 10A–10D are schematic details of various optically addressed and optoelectronic switch structures.
Figure 10B:
Figure 10C:
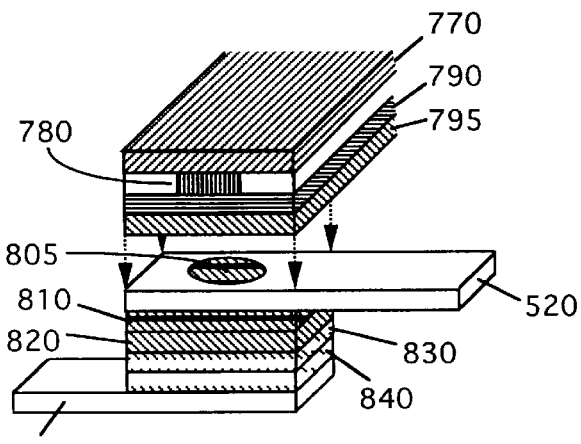
Figure 10D:
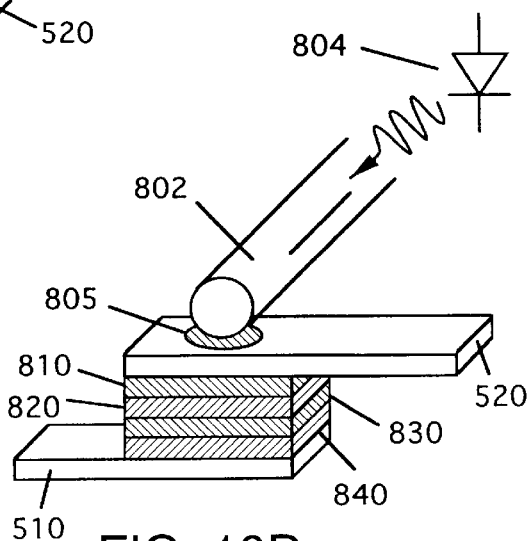

Referring to the detail of FIG. 6B, the digital column select scheme operates as follows: Rows of digital column switches 370,372 and 374 control column address lines such that all such said column switches in a given column must be in a closed circuit state (black filled box) for said column address line to be active. In order to control N column address lines it is required to have S rows of column switches such that S is the least integer greater than Log [N]/Log[2]. In the example shown in the detail 3 rows of such column switches 370,372 and 374 control 8 column address lines 270. The first such row is wired such that a logical 1 applied to the said row's column switch control line, 380, yields a state in which the first N/2 switches are in a closed circuit state and the second N/2 switches are in an open circuit state. The second row, 382, is wired such that said switch states alternate with a period of $N*2^{-2}$. The $m^{th}$ row alternates with a period of $N*2^{-m}$. Such a configuration allows for the unique selection of a single column address line such that said selected column address line becomes active with the potential applied to common column address bias 395. In the example shown in the detail column address line 3 becomes active upon application of the logical values 1, 0, 1 to column switch control lines 380, 382 and 384 respectively.

Finally it is also understood that any other suitable digital scheme in which each page has a page address may be employed as is known in the literature and prior art of display addressing.

Referring to FIGS. 7A–7D, a great many electronically addressable contrast media are known in the literature and prior art. In one embodiment a dielectric sphere 440 with substantially different contrast hemispheres may be microencapsulated in a microcapsule 420 and may be free to rotate in a fluid 430. The orientation of such a sphere may be controlled via the applied potential difference between electrode or address line 400 and 410. If one or both such electrodes are substantially transparent then an electronically addressable contrast may be effected. Such systems are known to posses inherent bistability or memory during open circuit due to electrostatic stiction.

In another system polymer dispersed liquid crystals (PDLCs) 450 may be microencapsulated or encapsulated in a microcapsule or capsule 420. In the absence of an applied bias between electrodes 400 and 410 said PDLCs are not oriented and are thus highly scattering and thus opaque. Under the application of a bias said PDLCs become aligned and are thus substantially transmitting. Thus, again, an electronically addressable contrast may be effected. Additionally such a contrast system may be a polymer stabilized system as is known in the prior art such that said system exhibits bistability.

In another system oriented LCD molecules 470 which may be microencapsulated in microcapsule 420 may be caused to rotationally orient and thus change the polarization of incident light upon application of a bias between 400 and 410. When viewed through a polarizer 460 said arrangement may again effect an electronically addressable contrast media.

In another system an electrochromic material 480 and an electrolyte 490 which may be a solid electrolyte are sandwiched between electrodes 400 and 410. Application of a potential difference between said electrodes effects an electronically addressable change of contrast. Said electrochromic systems are known in the prior art to be capable of memory, threshold, color capabilities and operability with a solid electrolyte system.

It is understood that any other electronically addressable contrast media may readily be substituted for those described above.

Referring to FIGS. 8A–8E, means are described for implementing address line control switches. Referring to the left uppermost figure address input line 510 is separated from address output line 520 by means of space 570 which may contain a polarizable fluid, conducting beads or filings or other such substance such that when a bias is applied between switch control lines 530 and 540 setting up an electrostatic field through insulators 550 and 560 and space 570 such that a substantial decrease in resistivity is effected between lines 510 and 520.

In another system address input line 510 is separated from address output line 520 by means of space 600 which may contain magnetically poled microspheres 610 which have a substantially conducting hemisphere and a substantially insulating hemisphere. Application of a current to loop control line 580 effects a magnetic field as depicted which causes said microspheres to line up with said substantially conducting hemisphere oriented such that they bridge said gap or space 600 thus effecting a substantially closed circuit between 510 and 520. Insulator 590 insulates said switch control lines from said address lines.

In another system address input line 510 is separated from address output line 520 by means of space 630 which contains magnetically poled and electrically conducting spheres 640. Application of a current to switch control line 620 effects the generation of a magnetic field as depicted causing said spheres to line up forming a conducting bridge between 510 and 520 as is known in the literature and thus effecting a substantially closed circuit between 510 and 520.

In another system address input line 510 has integral to it a conducting cantilever 515 separated from address output lines 520 by means of a gap. Application of a potential difference between line 510 and switch control line 650 causes an electrostatic attraction between said cantilever and said address output line thus effecting a substantially closed circuit between 510 and 520. Insulator 660 insulates said switch control line from said address output line.

In another system address input line 510 has integral to it a conducting cantilever which further has integral to it a magnetic substance 690. Said magnetically active conducting cantilever is separated from address output lines 520 by means of a gap. Application of a current to switch control loop 670 effects the generation of a magnetic field which causes said conducting cantilever to bend and make contact with said address output line thus effecting a substantially closed circuit between 510 and 520. Insulator 680 insulates said switch control line from said address output line.

Referring to FIGS. 9A–9E, several schemes are known in the literature and the prior art for effecting an electronic switch or transistor function without moving parts. Referring to the upper figure address input line 510 is electrically isolated from address output line 520. Layers of scandium diphthalocyanine (ScPc$_2$) 740, Nickel Pthalocyanine (NiPc) 730, Silicon Dioxide (SiO$_2$) 720 and n doped silicon (n-Si) bridge said address lines. By incorporating a control gate 700 a field-effect transistor in this case employing a dipthalocyanine thin film may be realized as is known in the literature. Such a structure may act as an address control line switch as said gate 700 may substantially control the flow of current from said address input line 510 to said address output line 520.

In another arrangement address input line 510 is isolated from address output line 520 by means of a stack including semiconducting polymer layers 750 and a switch control line 760 consisting of a camphor sulphonic acid protonated polyaniline (PANI-CSA) grid electrode filled with a semiconducting polymer. Such a structure may act as an address control line switch as such structure as just described forms a polymer grid triode (PGT) as is known in the literature such that said switch control line 760 may substantially control the flow of current from said address input line 510 to said address output line 520. Switch control line 760 may alternatively consist of a metal film in which case the described structure forms a current switch.

In another scheme a bipolar spin switch is formed by means of paramagnetic metal film 850 and ferromagnetic films 870 and 880. A bias applied between nonmagnetic metal electrode 860 and ferromagnetic film 870 serves to regulate the current between input electrode 510 and output electrode 520 thus forming a switch as is known in the existing literature.

In another scheme a hall effect switch may be effected whereby a potential may be formed across a hall effect material 910 between input electrode 510 and output electrode 520 by means of applying simultaneously an incident current injected by means of electrode 890 and collected by means of electrode 900 and a magnetic field H, perpendicular to said current, created by means of application of current to loop control line 670 and insulated by insulator 680.

In another scheme, curved resistor 930 which is electrically but not thermally insulated by means of insulator 940 may be caused to be heated by means of application of a current to said resistor causing the impedance in thermistive material 920, which posses a negative temperature coefficient of resistance, to drop thus lowering the impedance between input electrode 510 and output electrode 520.

Some of the above described devices such as those formed of conducting polymers have considerable utility in the present application as they posses the property of structural flexibility, tunable electronic properties and simplified deposition procedures (such as spin casting) which may be suitable for certain substrates such as real paper or paper like substrates. It is understood however that standard inorganic semiconductor technology such a Si or GaAs may be employed especially if suitable substrates such as ultra thin glass were employed for part or all of the page display.

Referring to FIGS. 10A–10D, means are described for implementing control switches based on optical control or optoelectronic devices. Referring to the left uppermost figure electroluminescent material 780 is sandwiched between exciting electrodes 770 and 790 forming an electroluminescent light emitting structure which is electrically isolated by means of transparent isolator 795. Emitted light from said electroluminescent light emitting structure causes photoconductor 760 to undergo a decrease in impedance thus lowering the effective impedance between input electrode 510 and output electrode 520 as is known in the literature. Layer 800 is an opaque layer which serves to optically shield other components from said light emitting structure.

Alternatively a switch may be constructed where said electroluminescent light emitting structure is replaced by an optical fiber 802 which may be modified to scatter light to said photoconductor 760 and optical fiber light source 804 which may be a light emitting diode or laser diode or other suitable light source.

In another arrangement, said photoconductor may be replaced by a photodiode composed of an output electrode 510 with aperture 805, a heavily doped p+ layer 810, a depletion layer 820, a lightly doped n-type layer 830, an n+ layer 840 and an input electrode 520. Alternatively it is understood that any other photodiode or phototransistor structure as is known in the prior art may be employed.

Figure 11B:
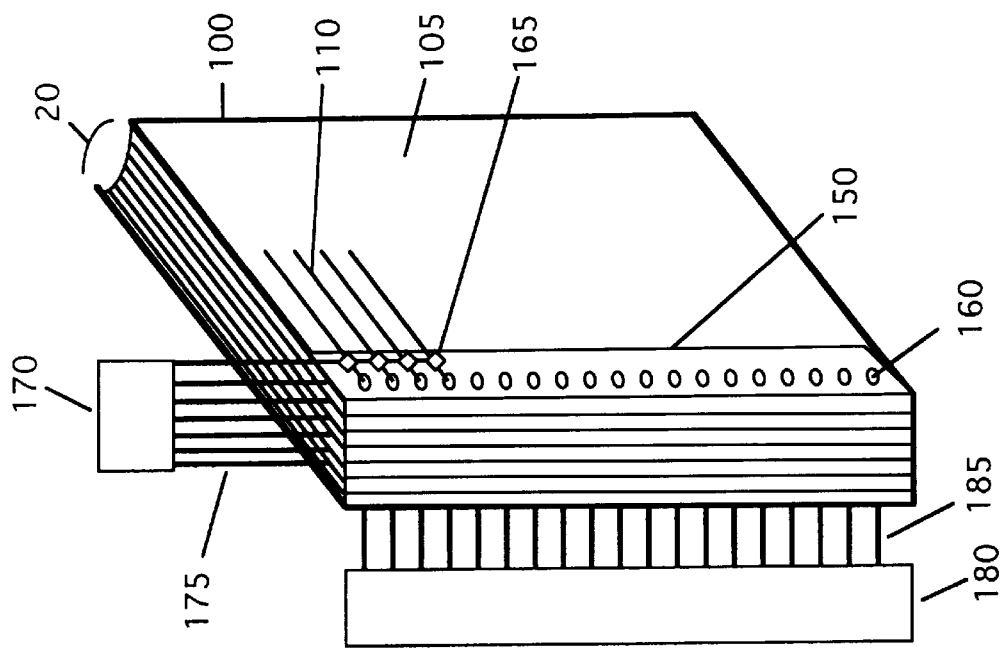
FIGS. 11A and 11B are partially perspective and partially schematic views of a single page of an electronic book and a means for binding a multiplicity of such pages.
Figure 11A:
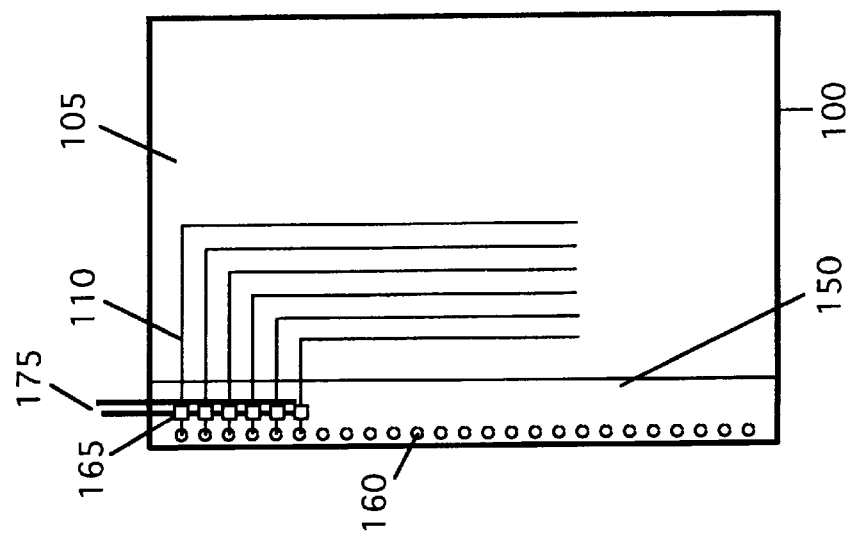

FIGS. 11A and 11B depict a preferred construction of a single electronically addressable page 100 and the means by which a multiplicity of said pages may be bound to form an ensemble of multiple page displays 20. Referring to the schematic of the single page (FIG. 11B), primary page substrate 105 may additionally encompass a second substrate part 150 which may be of a different material than said primary substrate such as a plastic or glass material with substantially different mechanical or electronic properties than the primary substrate material. Said second substrate material may have situated upon it page strobe or address logic 165 and page strobe or page address control lines 175. Said second substrate may further encompass apertures 160.

Referring to the perspective view of FIG. 11A, a multiplicity of pages such single page displays 100 may be combined to form a page display ensemble 20. Row or column address lines 110 may be connected to said apertures 160 such that display driver lines 185 may connect said address lines of each page 100 in said page ensemble thus forming common address lines from page to page. Such display driver lines may then further be connected to display driver 180. Such display driver lines which are common to each display page and which further connect through said apertures of said display pages may further serve to mechanically bind said pages to form said page display ensemble. Page strobe or page address lines 175 which are not common to each page may be connected to page strobe or page address driver 170.

Alternatively said substrate 105 may be of a single material. In another configuration said apertures 160 may be obviated and said control lines may be extended to the page edge where they may be connected to said driver lines. In another configuration additional mechanical bindings may be employed to mechanically bind said pages. It is readily understood that additional or alternative techniques of mechanical binding as is known in the art of book manufacture and other means of electrical connection as is known in the art of electronics and display manufacture may be employed.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An electronically addressable display comprising:

a substrate having a surface;

an electronically addressable display media printed on said surface of said substrate; and a plurality of analog or digital logic elements printed on said surface of said substrate, said plurality of printed logic elements matrix-addressing said printed display media.

2. The electronically addressable display of claim 1 wherein said display media is bistable.

3. The electronically addressable display of claim 1 wherein said substrate defines a plurality of apertures.

4. The electronically addressable display of claim 1 further comprising a plurality of address lines printed on said substrate, said address lines in electrical communication with said printed display media and said printed logic element.

5. The electronically addressable display of claim 1 wherein said printed logic element comprises a polymeric transistor.

6. The electronically addressable display of claim 1 wherein said printed logic element comprises an organic transistor.

7. The electronically addressable display of claim 1 wherein said printed logic element comprises a solution-deposited polymeric transistor.

8. The electronically addressable display of claim 1 wherein said printed logic element comprises an opto-eletronic switch.

9. An electronically addressable display comprising:

a plurality of substrates integrated to form a display ensemble, each of said substrates having a surface;

an electronically addressable display media printed on said surface of each said plurality of substrates;

a plurality of analog or digital logic elements printed on said surface of each of said plurality of substrates, said plurality of printed logic elements matrix-addressing said printed display media.

10. An electronically addressable display of claim 9 wherein said display media is bistable.

11. The electronically addressable display of claim 9 wherein each of said plurality of substrates define a plurality of apertures.

12. The electronically addressable display of claim 9 further comprising a plurality of address lines printed on each of said plurality of substrates, each of said plurality of address lines in electrical communication with each respective printed display media and printed logic element.

13. The electronically addressable display of claim 9 wherein said printed logic element comprises a polymeric transistor.

14. The electronically addressable display of claim 9 wherein said printed logic element comprises an organic transistor.

15. The electronically addressable display of claim 9 wherein said printed logic element comprises a solution-deposited polymeric transistor.

16. The electronically addressable display of claim 9 wherein said printed logic element comprises an optoelectronic switch.

* * * * *